United States Patent [19]

Klein

[11] 3,970,828

[45] July 20, 1976

[54] SYSTEM FOR PRECISION TIME MEASUREMENT

[75] Inventor: Albert M. Klein, Chatsworth, Calif.

[73] Assignee: International Telephone and Telegraph Corporation, New York, N.Y.

[22] Filed: Jan. 13, 1975

[21] Appl. No.: 540,332

[52] U.S. Cl. .......................... 235/92 T; 235/92 TF; 235/92 CA; 235/92 DE; 235/92 R

[51] Int. Cl.[2] ................... H03K 21/00; H03K 21/30

[58] Field of Search .......... 235/92 T, 92 TF, 92 CA, 235/92 LG, 92 CT, 92 B, 92 MS, 92 MT, 92 EL, 92 NT, 92 FO, 92 MP, 92 DE; 328/72, 73, 74, 75; 324/83 R, 83 D; 307/220 R, 221 R

[56] References Cited

UNITED STATES PATENTS

| | | | |
|---|---|---|---|
| 3,380,020 | 4/1968 | Clark | 235/92 T |
| 3,840,174 | 10/1974 | Craft | 235/92 T |
| 3,867,614 | 2/1975 | White | 235/92 T |
| 3,878,370 | 4/1975 | Santomango et al. | 235/92 T |

*Primary Examiner*—Gareth D. Shaw
*Assistant Examiner*—John P. Vandenburg
*Attorney, Agent, or Firm*—A. Donald Stolzy

[57] ABSTRACT

A system for measuring a first period of time, for example a period between a pair of pulses, with an extraordinarily high degree of accuracy. Two ramp voltages of different slopes are started in synchronism with the first occurring pulse. The ramp with the largest slope is then sampled and held on receipt of the second occurring pulse. A counter counts a clock of a moderate pulse repetition frequency (PRF) during a second period occurring between the time the ramps are started and the time the amplitude of the ramp of the smaller slope becomes equal to the sampled amplitude of the ramp of the larger slope. The count stored in the counter at the end of the second period is then directly proportional to the first period or is equal thereto. Moreover, the count can be far more precise than it would be by counting the clock PRF during the first period. By making the larger ramp slope 1,000 times as large, for example, as the smaller ramp slope, the precision of the measurement may be increased 1,000 times for the same clock PRF.

4 Claims, 2 Drawing Figures

SYSTEM FOR PRECISION TIME MEASUREMENT

BACKGROUND OF THE INVENTION

This invention relates to time measurement, and more particularly to apparatus for producing signals at the beginning and end of a second time interval larger than, but directly proportional to a first time interval.

In the past it has been the practice to develop a digital number proportional to a time interval by counting a clock during a period of interest between a pulse pair. However, when the period of interest approaches the pulse period of the clock, a measurement can be made with little or no accuracy in the first, second and/or third or other significant digits.

SUMMARY OF THE INVENTION

In accordance with the system of the present invention, the abovedescribed and other disadvantages of the prior art are overcome by "stretching" a first period of time between two successive occurrences so that the "stretched" second period of time is directly proportional to the first period.

The above-described and other advantages of the present invention will be better understood from the following detailed description when considered in connection with the accompanying drawings.

BRIEF DESCRIPTION OF THE DRAWINGS

In the drawings which are to be regarded as merely illustrative.

DESCRIPTION OF THE PREFERRED EMBODIMENT

Figure 1:
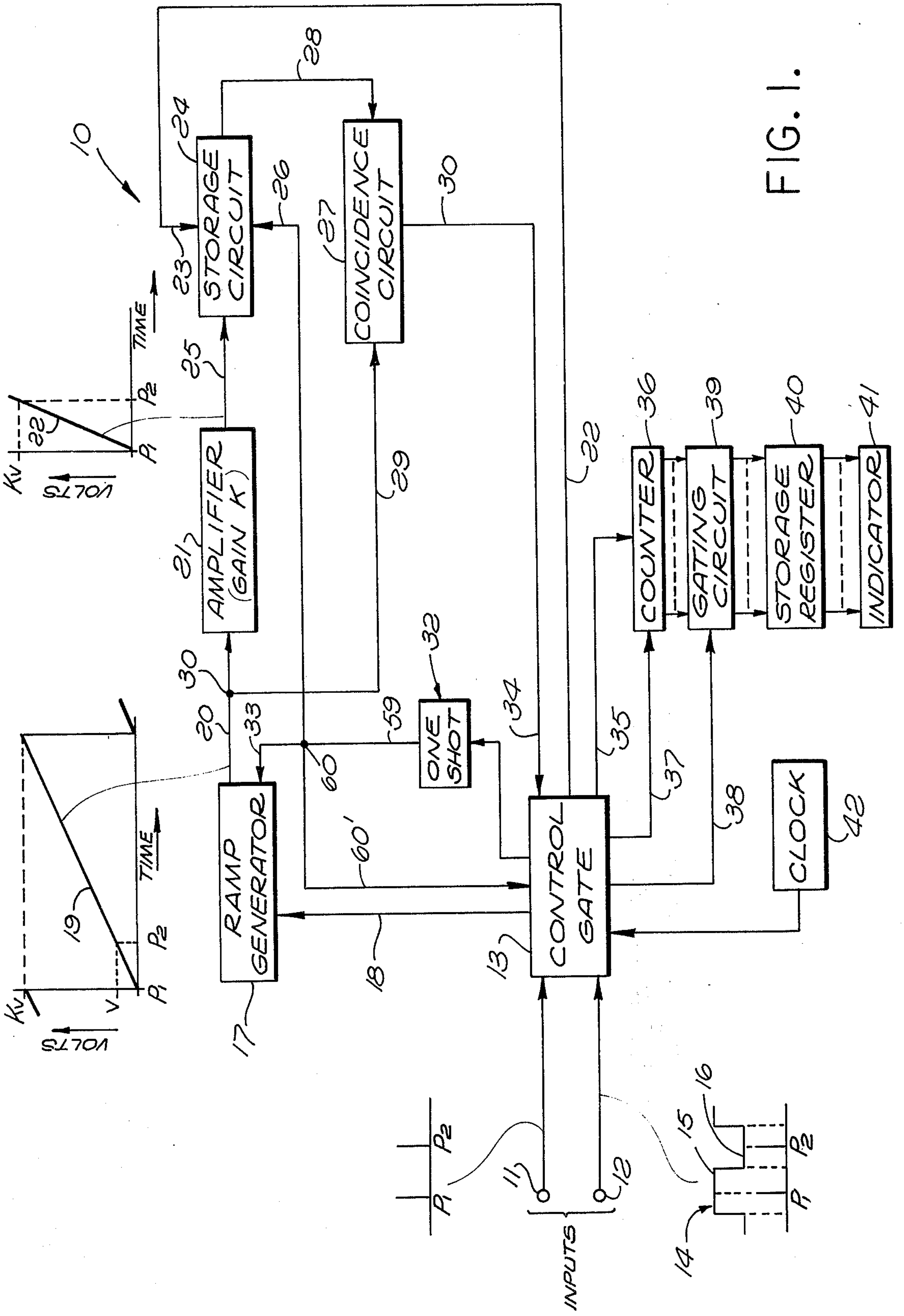
FIG. 1 is a block diagram of a precision time measurement system constructed in accordance with the present invention.

In FIG. 1, the system of the present invention is illustrated at 10 having input terminals 11 and 12 connected to a control gate 13.

The purpose of the invention is to measure, with substantial precision, the time between the occurrences of two pulses $P_1$ and $P_2$. A rectangular wave of a mark-to-space ratio equal to 1:1 is impressed upon input terminal 12. This rectangular wave is illustrated at 14 in FIG. 1.

If desired, pulse $P_1$ may occur during the high level portion 15 of rectangular wave 14, whereas the pulse $P_2$ may occur somewhere during the low level portion 16 of rectangular wave 14.

Responsive to the inputs on terminals 11 and 12, gate 13 produces a rectangular wave output and impresses the same on a ramp generator 17 over a lead 18. this produces an output ramp voltage illustrated at 19 on an output lead 20 of ramp generator 17. The ramp 19 is impressed upon the input of an amplifier 21, the output of which is illustrated at 22.

Control gate 13 produces an output pulse on an output lead 22 which is connected to an input lead 23 of a storage circuit 24. Storage circuit 24 is a conventional sample-and-hold circuit which samples the output of amplifier 21 when pulse $P_2$ occurs.

If, as shown in FIG. 1, ramp 19 reaches a voltage $v$ when the pulse $P_2$ occurs, ramp 22 reaches an amplitude of Kv when pulse $P_2$ occurs, where K is the gain of amplifier 21.

The output of amplifier 21 is impressed upon storage circuit 24 over a lead 25. Storage circuit 24 is reset over a lead 26 connected from an output lead 59 of a one shot multivibrator 32 via a junction 60.

Storage circuit 24 supplies a voltage to a coincidence circuit 27 over a lead 28 which thus remains constant at Kv at and after the occurrence of pulse $P_2$. The output of ramp generator 17 is also impressed upon coincidence circuit 27 over a lead 29 connected to a junction 30 with lead 20 that is connected from the output of ramp generator 17 to the input of amplifier 21. Ramp 19 thus continues to rise until it becomes equal to the voltage on lead 28, at which point coincidence circuit 27 produces a pulse on an output lead 30 that is connected to an AND gate 31 shown in control gate 13 in FIG. 2. In FIG. 1, one shot multivibrator 32 is then connected from a junction 31 in control gate 13 in FIG. 2 to a reset input lead 33 of ramp generator 17 via junction 60 to reset ramp generator 17 in FIG. 1. A lead 34 is also connected from lead 30 and provides a reset input to control gate 13.

Control gate 13 has an output lead 35 which is connected to a counter 36 to reset the same immediately prior to the beginning of the count.

Control gate 13 has another output lead 37 connected to counter 36 to supply clock pulses thereto over an appropriate interval.

control gate 13 has still another output lead 38 connected to a gating circuit 39 to sample the output of counter 36 when a pulse is impressed upon gating circuit 39 via lead 38. This sample is stored in a storage register 40. The number stored in storage register 40 is then indicated in an indicator 41.

Gating circuit 39, storage register 40 and indicator 41 are connected in succession from counter 36, gating circuit 39 receiving the additional actuating input pulse over lead 38. A clock 42 provides an additional input to control gate 13.

The output of one shot 32 is also connected to control gate 13 via lead 59, junction 60 and a lead 60'.

Figure 2:
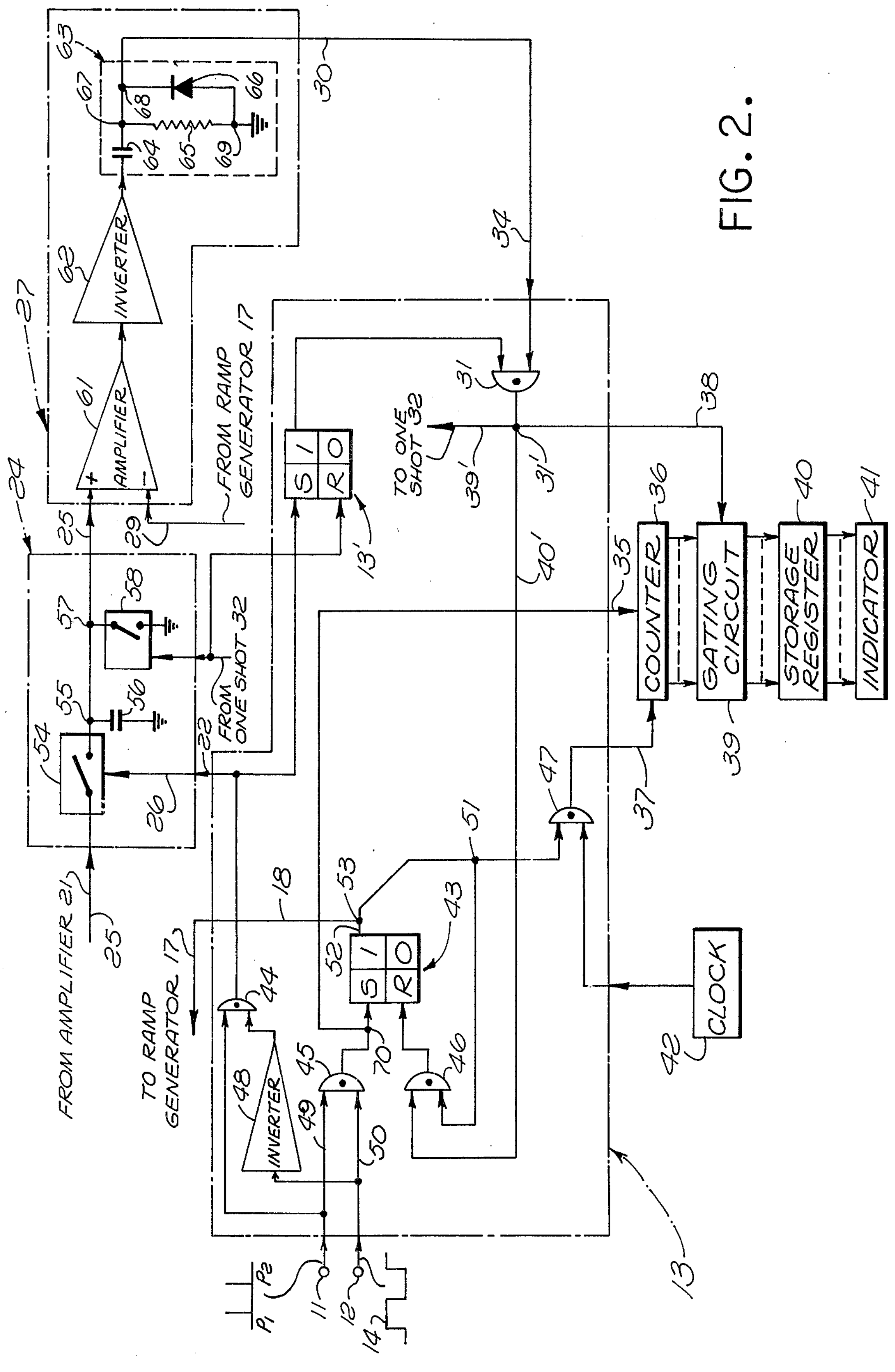
FIG. 2 is a more detailed diagram of a portion of the system shown in FIG. 1.

In FIG. 2, a flip flop 43 is employed in control gate 13. AND gates are provided at 44, 45, 46 and 47 in control gate 13. Each of the AND gates 44, 45, 46 and 47 is provided with two inputs and one output.

One of the inputs to AND gate 44 is connected from input terminal 11. The other input to AND gate 44 is connected from input terminal 12 through an inverter 48.

AND gate 45 has first and second inputs 49 and 50 connected from terminals 11 and 12, respectively.

AND gate 46 has one input connected from junction 31', and another input connected from a junction 51.

The outputs of AND gates 45 and 46 are respectively connected to the set and reset inputs of flip flop 43.

Flip flop 43 has an output 52 connected to a junction 53. Junctions 51 and 53 are connected together. Lead 18 is connected from junction 53 to the input of ramp generator 17.

AND gate 47 has one input connected from junction 51 and a second input connected from the output of clock 42.

The output of AND gate 47 is connected to lead 37.

A more detailed construction of storage circuit 24 and coincidence circuit 27 are shown in FIG. 2. In storage circuit 24, an electronic sampling switch 54 is provided that is connected from lead 25 to a junction 55 and operated over lead 26 connected from the output of AND gate 44. A capacitor 56 is connected from junction 55 to ground. A junction 57 is also provided in storage circuit 24. Another electronic switch is provided at 58 and connected from junction 57 to ground. Switch 58 is operated by a pulse appearing at the output of one shot 32.

Coincidence circuit 27 includes a differential amplifier 61, an inverter 62 and a differentiator 63 connected in succession in that order from leads 25 and 29 to lead 30.

Lead 25 is connected to the noninverting input of differential amplifier 61. The output of ramp generator 17 over lead 29 is connected to the inverting input of differential amplifier 61.

Differentiator 63 includes a capacitor 64, a resistor 65 and a diode 66. Differentiator 63 also has junctions 67, 68 and 69. Capacitor 64 is connected from the output of inverter 62 to junction 67. Junctions 67 and 68 are both connected to output lead 30. Resistor 65 is connected between junctions 67 and 69. Diode 66 is connected between junctions 68 and 69, and is poled to be conductive in a direction toward junction 68, junction 69 being grounded.

In FIG. 2, lead 35 is connected from a junction 70 with the output lead of AND gate 45.

Indicator 41 may be calibrated in units of time. Indicator 41 may be a binary or decimal indicator. Counter 36 with gating circuit 39, storage register 40 and indicator 41 each may be entirely conventional. Moreover, the combination thereof may also be entirely conventional and may be considered to be an updated counter.

Although the combination thereof is new, each block shown in FIG. 1, except control gate 13, may be, by itself, entirely conventional.

Each of the AND gates 44, 45, 46 and 47 may be entirely conventional. All flip flops and AND gates may be entirely conventional. However, the combination of the AND gates and the flip flops is new.

Each component part of storage circuit 24 shown in FIG. 2 may be entirely conventional. Any conventional storage circuit may be employed for storage circuit 24. The storage circuit 24 shown in FIG. 2 is in fact conventional; however, the combination of the storage circuit 24 in FIGS. 1 and 2 with the other components shown therein is new.

Any conventional coincidence circuit may be employed for coincidence circuit 27 shown in FIGS. 1 and 2. The combination of coincidence circuit 27 with the other components is new; however, each of the component parts and the combination thereof shown in the dotted block 27 in FIG. 2 may be old in the art. Differential amplifier 61 may be entirely conventional. The same is true of inverter 62 and differentiator 63.

OPERATION

In the operation of the system of the present invention illustrated in FIGS. 1 and 2, when a pulse $P_1$ is impressed upon terminal 11, AND gate 45 sets flip flop 43, and the 1 output of flip flop 43 is raised to a high level and impressed over lead 18 on ramp generator 17. Ramp 19 in FIG. 1 is then generated during the rectangular wave on lead 18 and started on the occurrence of pulse $P_1$. The same thing is true of ramp 22. However, the output of AND gate 44 causes the output of amplifier 21 to be sampled and held by capacitor 56 on the occurrence of pulse $P_2$. This sampled voltage is then applied to the noninverting input of amplifier 61 in coincidence circuit 27. After sampling, the voltage upon the input lead 25 to coincidence circuit 27 therefore remains constant for a certain time interval during which the output amplitude of ramp generator 17 on lead 20 increases as at 19 and is impressed upon coincidence circuit 27 over lead 29.

When the amplitude on ramp 19 becomes equal to the sampled amplitude (constant) on input lead 25 of coincidence circuit 27, coincidence circuit 27 produces an output pulse on lead 30 which transfers the count in counter 36 to storage register 40 and via AND gates 31 and 46 resets flip flop 43. AND gate 31 is disabled by a flip flop 13' from reset by one shot 32 to the occurrence of $P_2$. AND gate 31 is enabled by flip flop 13' from the occurrence of $P_2$ to an output from one shot 32.

As shown in FIG. 2, junction 31' is connected from the output of AND gate 31 to leads 38, 39' and 40' connected to gating circuit 39, one shot 32, and AND gate 46, respectively.

During the time that the 1 output of flip flop 43 is high, AND gate 47 passes the output pulses of clock 42 to counter 36. The count in counter 36, upon the production of the reset pulse on output lead 30 of coincidence circuit 27, is thus directly proportional to the time during which the 1 output of flip flop 43 is high. This is also directly proportional to the time interval between the occurrences of pulses $P_1$ and $P_2$.

Indicator 41 thus can indicate, by calibration or without, in many conventional ways, a time directly proportional to the time interval between pulses $P_1$ and $P_2$ or equal to such time in seconds or in a fraction of a second.

A typical value for K would be $K = 1,000$.

The present invention may be used in a great many ways. For example, $P_1$ may be the transmitted pulse and $P_2$ may be the reflected pulse in a monopulse radar. The time measurement described hereinbefore may thus be directly proportional to slant range, and indicator 41 may be calibrated in miles or other linear measure.

The system of the present invention may also be employed in automatic or other ground controlled approach radar systems, in a process controller or otherwise.

What is claimed is:

1. A system for producing a real time precision output, said system comprising: a ramp generator having start and reset inputs, and an output; first means to apply a start signal to said ramp generator start input to cause the output thereof to rise until reset; an amplifier having an input connected from the output of said ramp generator, said amplifier having a gain larger than unity, said amplifier having an output; a sample and hold storage circuit having a sample input, a sample gate input, a reset input, and an output, said storage circuit sample input being connected from the output of said amplifier; a coincidence circuit having an input and an output, said coincidence circuit being connected from the outputs of both said ramp generator and said storage circuit output for producing a main pulse at said coincidence circuit output when the signals at said ramp generator and storage circuit outputs have equal magnitudes; second means to apply a stop signal to said storage circuit sample gate input; and third means connected from said coincidence circuit output to said ramp generator reset input, the first period of time between the occurrences of the said application of said start signal and the production of said main pulse being longer than, but directly proportional to the second period of time between the occurrences of said start and stop signals.

2. The invention as defined in claim 1, wherein said first means includes fourth means to supply a first pulse at the beginning of said start signal, a flip flop having set and reset inputs and 1 and 0 outputs, said fourth means being connected to said flip flop set input, the start input of said ramp generator being connected from the 1 output of said flip flop, a first AND gate having first and second inputs, and an output, said first AND gate first input being connected from said flip flop 1 output, said first AND gate second input being connected from said coincidence circuit output, said first AND gate output being connected to said flip flop reset input, a clock, a second AND gate having first and second inputs connected from said flip flop 1 output and said clock, respectively, a digital counter having count and reset inputs connected respectively from said second AND gate output and said fourth means; a gating circuit, a storage register and a digital indicator connected in succession in that order from said counter and forming an updated counter therewith, said gating circuit having a sampling input connected from said coincidence circuit output, said indicator displaying a digital number equal, in units of time, to said second period.

3. A system for producing a real time precision output, said system comprising: first means having start and reset inputs, and an output for producing a first ramp signal at said output thereof; second means to apply a start signal to said first means start input to cause the output thereof to initiate and to continue to produce said first ramp signal until reset; third means also responsive to said start signal for producing a second ramp signal having a slope greater than that of said first ramp signal, said third means having an output; a sample and hold storage circuit having a sample input, a sample gate input, a reset input, and an output, said storage circuit sample input being connected from the output of said third means; a coincidence circuit having an input and an output, said coincidence circuit being connected from the outputs of both said first means and storage circuit outputs for producing a main pulse at said coincidence circuit output when said first ramp signal becomes equal in magnitude to that of said second ramp signal; fourth means to apply a stop signal to said storage circuit sample gate input; and fifth means connected from said coincidence circuit output to said first means reset input, a first period of time between the occurrences of the said application of said start signal and the production of said main pulse being longer than, but directly proportional to a second period of time between the occurrences of said start and stop signals.

4. A system for producing a real time precision output, said system comprising: first means having start and reset inputs, and an output for producing a first ramp signal at said output thereof; second means to apply a start signal to said first means start input to cause the output thereof to initiate and to continue to produce said first ramp signal until reset; third means connected from said second means, said third means being responsive to said start signal for producing a second ramp signal having a slope greater than that of said first ramp signal, said third means having an output; a sample and hold storage circuit having a sample input, a sample gate input, a reset input, and an output, said storage circuit sample input being connected from the output of said third means; a coincidence circuit having an input and an output, said coincidence circuit being connected from the outputs of both said first means and storage circuit outputs for producing a main pulse at said coincidence circuit output when said first ramp signal becomes equal in magnitude to that of said second ramp signal; fourth means to apply a stop signal to said storage circuit sample gate input; and fifth means connected from said coincidence circuit output to said first means reset input, a first period of time between the occurrences of the said application of said start signal and the production of said main pulse being longer than, but directly proportional to a second period of time between the occurrences of said start and stop signals.

* * * * *